CIRCUIT ARRANGEMENT FOR ELECTRO-EROSION IMPULSE GENERATOR

Filed Sept. 1, 1967

INVENTORS
WERNER ULLMANN
COSTANTINO TADINI

BY Jacobi & Davidson
ATTORNEYS

United States Patent Office 3,492,530

Patented Jan. 27, 1970

3,492,530
CIRCUIT ARRANGEMENT FOR ELECTRO-EROSION IMPULSE GENERATOR

Werner Ullmann and Costantino Tadini, Locarno, Switzerland, assignors to A. G. fur Industrielle Elektronik Agie Losone B. Locarno, Switzerland, a corporation of Switzerland Filed Sept. 1, 1967, Ser. No. 665,134
Claims priority, application Switzerland, Sept. 7, 1966, 12,943/66
Int. Cl. H05b *43/00*
U.S. Cl. 315—171 13 Claims

ABSTRACT OF THE DISCLOSURE

An electro-erosion impulse circuit devoid of energy storage elements, which is disposed between a source of direct-current and a work gap and comprises at least one electronic switch placed in parallel circuit to said work gap, for generating working sparks in the work gap defined by the spacing between a processing electrode and a workpiece, wherein an unidirectional current conducting means in the inductance-free and capacitance-free erosion circuit is provided for each electronic switch, said unidirectional current conducting means being connected in series circuit between said work gap and a junction to one pole of said electronic switch, said unidirectional current conducting means being connected in the same polarity to the polarity of said electronic switch, the arrangement being such that overload of an individual switch is prevented and undesirable oscillation within the circuit is suppressed.

Background of the invention

This invention relates to an electro-erosion circuit arrangement of the type having no energy storage member, which circuit is disposed between a unidirectional-voltage source and a work gap and contains at least one electronic switch in parallel with the work gap for generating working sparks in the work gap, the work gap being defined by the spacing between a processing electrode and a workpiece.

With known pulse generators comprising transistors as electronic switches in their erosion circuit, the processing of workpieces by means of working sparks between the processing electrode and the workpiece can be carried out in two ways, One type of generator utilizes a transistor arranged as an electronic switch in series with the work gap. The erosion circuit is thus formed by a unidirectional-voltage source, the electronic switch and the work gap. By actuation of the electronic switch, a voltage in the form of a pulse is applied to or removed from the workpiece. The electronic switch is actuated by a control circuit by which the repetition frequency and the pulse interval ratio of the working sparks is adjusted in known manner.

Another type of pulse generator utilizes a transistor as an electronic switch arranged in parallel with the work gap, which is defined by the processing electrode and by the workpiece. The erosion circuit is again formed by a unidirectional-voltage source, the electronic switch and the work gap. The transistor is likewise opened or closed by a control circuit arrangement as described above. When the transistor is open, the full voltage of the unidirectional-voltage source is present at the work gap, so that a working spark is generated. When the transistor is closed, i.e. has been brought into the conductive state, the unidirectional-voltage source and the work gap are simultaneously short-circuited, and no working spark can thus be set up in the work gap.

Since large workpieces must be processed in one operation in electro-erosion metal working, ever increasing requirements must be met by the electronic switches. For switching high current strengths of, for example, 600 and more amperes, electronic switches are connected in parallel since a single transistor, for example, can switch currents of only about 5 amperes and a single thyristor can switch currents of only about 300 amperes. In the case of the parallel connection of more than two electronic switches, a practical disadvantage arises in that one switch or the other cannot be simultaneously brought into the conductive or non-conductive state, although all the switches are actuated from a common control arrangement.

Such large deviations of the switching times are due to the relatively high tolerances of technically and commercially obtainable electronic switches. If a plurality of switches in parallel with the work gap are employed, and the state of one switch is changed earlier than that of the other switches, the whole current of the conductors leading to the other switches flows through the switch whose state has first been changed, by way of one pole of the work gap, for example the processing electrode, to which the said conductors are also connected. This means that the electronic switch whose state is first changed is briefly overloaded. If such overloading is frequent and/or heavy, this switch is destroyed. After destruction of this switch, the remaining switches still in good condition in the parallel arrangement are overloaded one after the other in exactly the same manner as already described, so that the whole parallel switch arrangement can eventually be destroyed.

In the case of known direct-current pulse generators which have no energy storage members in the electro-erosion circuit and utilize transistors as electronic switches, it is found in practice that distributed inductances and distributed capacitances of the electric conductors and of the electronic switches within the erosion circuit do not usually cause a disadvantageous influencing of the erosive spark processing in the work gap as long as the repetition frequencies are in the normal frequency range. However, if the repetition frequencies are raised, the aforesaid distributed inductances and capacitances do have an undesirable effect within the erosion circuit. After short-circuiting of the work gap by the electronic switch or switches connected in parallel therewith, a back-oscillation or over-oscillation of reverse polarity occurs at the processing electrode and at the workpiece after the spark takes place because of these distributed inductances and capacitances, whereby the wear on the processing electrode is considerably increased.

The invention has for its object to obviate the aforesaid disadvantages in pulse generators of the type described. Other and more specific objects of the instant invention include:

The provision of an electro-erosion circuit wherein individual switching elements are protected against overload; and The provision of an electro-erosion circuit wherein spurious and undesirable oscillations are suppressed.

Summary of the invention

The above and additional objects are achieved in that the instant invention contemplates the provision of a novel circuit arrangement for an electro-erosion impulse generator operable from a source of direct-current and containing no energy storage elements. Electronic switches are placed in parallel circuit to an erosion work gap to control the application of power thereto. Unidirectional current conducting elements are placed in series circuit with the work gap and the source of supply with one terminal of each unidirectional current conducting element being connected to one terminal of each electronic switch. The polarity of each unidirectional current conducting element is such that if one of a plurality of the parallel electronic switches does not function properly, the other electronic switches will not experience an overload. Additionally, the unidirectional current conducting elements prevent oscillation within the circuit caused by distributed inductance and capacitance of the conductors and other elements.

Brief description of the drawings

The invention will be better understood and other objects and features thereof will become apparent from the following description when read in conjunction with the annexed drawing wherein.

Description of the preferred embodiments

Figure 1:
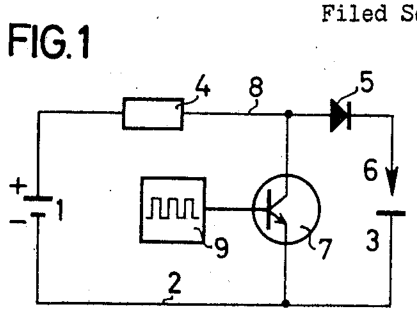
FIGURES 1 and 2 illustrate an electro-erosion circuit comprising an electronic switch in parallel with the work gap, and a unidirectionally conducting device.
Figure 2:
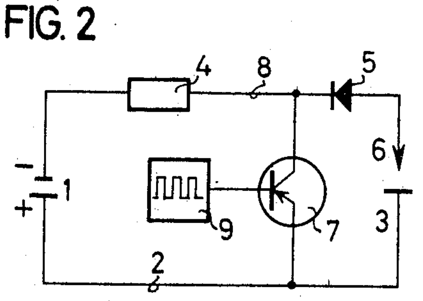

FIGURES 1 and 2 illustrate a preferred embodiment of an electro-erosion circuit consisting of a voltage source 1, a current limiting resistor 4, a unidirectionally conducting device 5 and a work gap 3, 6. A control unit 9 actuates an electronic switch 7 by means of the illustrated series of control pulses. When the switch 7 is in the non-conductive condition, the full voltage of battery 1 is present between the electrode 6 and the workpiece 3, so that a work spark is formed in the work gap. When the switch 7 is conductive, the voltage source 1 is short-circuited. Because of the unidirectional conducting device 5 in the conductor 8, no over-oscillation with reverse polarity can occur at the electrode 6, the workpiece 3, the conductor 2 and the switch 7, so that wear on the electrode 6 is prevented. In FIGURE 1, a npn-transistor is shown as the electronic switch 7. The base of this transistor is connected in known manner to the control unit 9, and the collector-emitter path lies between the conductors 8 and 2 in parallel with the work gap. The positive pole of the voltage source 1 is connected to the current-limiting resistor 4, and the negative pole is connected to the conductor 2.

FIGURE 2 illustrates a modification of the circuit shown in FIGURE 1 in that the electronic switch 7 comprises a pnp-transistor, the base of which being connected to the control unit 9, and the collector-emitter path of which being connected between the conductors 8 and 2. The negative pole of the voltage source 1 is connected to the current-limiting resistor 4, while the positive pole is connected to the conductor 2. The unidirectional conducting device 6 is also disposed in the conductor 8, but inversely in relation to the polarity shown in FIGURE 1. FIGURES 1 and 2 together show that a unidirectional conducting device 5 may be employed with a pnp- or npn-transistor 7 without difficulty in any electronic circuit in accordance with the instant invention. It is merely necessary for the polarity of the electronic switch and consequently that of the electro-erosion circuit to be taken into consideration. As the electronic switch 7, a controlled rectifier or a tube, may also be employed instead of a transistor. Since these types of electronic switches in parallel arrangement to the work gap are well known, no further details thereof will be mentioned. It is merely to be noted that the unidirectional conducting device 5, although shown as a diode in FIGURES 1 and 2 could be a semiconductor element having at least one control electrode (for example thyristor, transistor, magnetostrictive element) or an electron tube or gas discharge tube having at least one control grid. Such substitution also applies to the following FIGURES 3 to 6.

Figure 3:
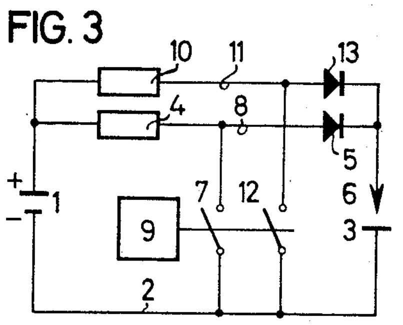
FIGURES 3 to 6 illustrate variants of the connections between a voltage source and the work gap with the aid of a number of electronic switches through unidirectionally conducting devices.

Another form of an electro-erosion circuit is shown in FIGURE 3. A unidirectional or direct-current voltage source 1, which is shown as a battery, is connected to the workpiece 3 through the conductor 2. The positive pole of this voltage source is connected through the current-limiting resistor 4 and the unidirectional conducting device 5 to the processing electrode 6. The electronic switch 7 is connected between the resistor 4 and the unidirectional conducting device 5. In FIGURE 3 and in the subsequent figures, the electronic switches have been drawn only as switching symbols. The various types of such switches are well known as described above do not form part of this invention. Connected to the control electrode of the electronic switch 7 is the control unit 9, which brings switch 7 into the conducting or non-conducting state. The control unit 9 does not form part of the invention, and will not be more fully described, since it is well known. Switch 7 is connected in parallel with the work gap defined by the electrode 6 and the workpiece 3 to be processed as shown. Connected to the positive pole of the unidirectional-voltage source 1 is an additional current-limiting resistor 10, which is connected through a conductor 11 to the collector of a second electronic switch 12 and to the anode of an additional unidirectional conducting device 13. The cathode of the unidirectional conducting device 13 is connected to the electrode 6 in the same way as the cathode of the unidirectional conducting device 5. Switch 12 is controlled in regard to its conducting and non-conducting states by the same control unit 9 as used for switch 7. Switch 12 lies between the conductors 11 and 2 of the erosion circuit. The unidirectional-voltage source 1, which again may be a battery or a rectifier arrangement, is short-circuited when the switches 7 and 12 are conductive. The unidirectional conducting devices 5 and 13 prevent the conductors 8, 11 from being connected together through the electrode 6.

For a better understanding of the invention, it will hereinafter be briefly described what would happen in the absence of the two unidirectional conducting devices. If switch 7 of the two electronic switches 7 and 12 opens somewhat earlier than switch 12, the normal current flows through the current-limiting resistor 10, through the conductor 11 and through switch 12 which is still in the conductive state, by way of the conductor 2 to the negative pole of the voltage source. At the same time, however, an additional current would flow through the current-limiting resistor 4, the conductor 8, to the processing electrode 6, the switch 12 and the conductor 2 to the negative pole of the voltage source. This additional current might bring about the destruction of the switch 12.

In order to prevent the above destructive operation, there are provided in accordance with FIGURE 3 two unidirectional conducting devices 5 and 13. Now, if switch 7 opens somewhat before switch 12, the additional current as discussed above through the current-limiting resistor 4, the conductor 8, and to the processing electrode 6 cannot flow through the switch 12 to cause destruction thereof because diode 13 is connected in the inverse or blocking direction. Consequently, switch 12 is protected. The same operation is evident if the two switches 7 and 12 are open and are brought into the conductive state by the control unit 9. Regardless of which of the switches first enters the conductive state, protection is afforded by the diodes 5 and 13 in such manner that no additional current can flow in the circuit.

Any desired number of switching arrangements shown in FIGURE 3 may be connected in parallel and be made to operate on a work gap 3, 6 as will be discussed in detail with reference to FIGURE 6. Such desired number of switching arrangements of FIGURE 3 may be controlled in common by a single control unit 9, control unit 9 bringing all the switches simultaneously into the conductive or non-conductive state.

Although the unidirectional conducting devices 5 and 13 have been referred to above as diodes which are arranged with same polarity to each electronic switch, it is possible within the scope of the invention to provide semiconductor elements comprising a control electrode instead of such diode semiconductor elements which are brought into the non-conducting or conducting state by the voltage applied between the anode and the cathode. For example, controllable rectifiers (thyristor) are contemplated as well as transistors instead of the diodes 5 and 13. Alternatively, a so-called magnetostrictive semiconductor element may be used. The latter requires as a means for controlling the conductive and non-conductive states, a magnetic field which suppresses or permits the electrode conduction in this semiconductor element. If semiconductor elements having a control electrode are employed, the control electrode must, of course, be connected to the control unit 9 such as shown in FIGURE 1. Finally, it is to be noted that it is readily possible to also employ a gas discharge tube or an electron tube having at least one control electrode, for example a thyratron, instead of the unidirectional conducting devices 5 and 13. Here again, the control electrode must be correspondingly connected to the control unit 9.

Figure 4:
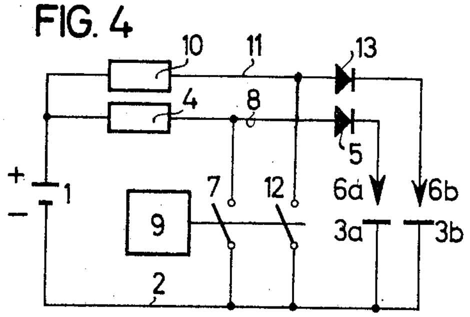

In FIGURE 4, the same component elements are provided in the electro-erosion circuit as have already been described with respect to FIGURE 3. The only difference resides in that the two parallel switches 7, 12 operate on two different work gaps. This has proved very advantageous, for example, in applications requiring relatively large processing electrodes. Since workpieces of ever increasing size are required for electro-erosion production of coachwork parts or of large forging dies, it has proved desirable to subdivide such large processing electrodes into a number of smaller parts and to connect each of these parts to a voltage source of sufficient output. The voltage source 1 is connected at its negative pole through the conductor 2 to the workpiece 3*a*, 3*b*. The positive pole of the voltage source 1 is connected through the current-limiting resistor 4, the conductor 8 and the unidirectional conducting device 5 to one part 6*a* of the processing electrode. The switch 7 is connected, between the conductor 8 and the conductor 2, in parallel with the work gap defined by 6*a* and 3*a*. The positive pole of the voltage source 1 is also connected to another part 6*b* of the processing electrode through the current-limiting resistor 10, the conductor 11 and the unidirectional conducting device 13. The switch 12, which is actuated by the same control unit 9 as the switch 7, lies between the conductor 11 and the conductor 2. If, in accordance with this embodiment, the control unit 9 brings both switches 7, 12 into the conductive state and the switch 7 is briefly rendered conductive before the switch 12, an additional current could flow through the switch 7 in the absence of the unidirectional conducting devices, 5, 13, by way of the current limiting resistor 10, the conductor 11, the electrode part 6*b* and the electrode part 6*a*, in a manner similar to that described in FIGURE 3. It is to be noted that the parts 6*a*, 6*b* of the processing electrode are separated by a gap which is narrower than the work gap between the electrode and the workpiece. Thus, it will be appreciated that if the switch 7 becomes conductive earlier, a certain potential change occurs between the two electrode parts 6*a*, 6*b*, and the current will flow in the very narrow gap separating the two electrode parts. This current would flow as an additional current through the switch 7 and thereby possibly destroy it. It will therefore be apparent from the foregoing that even in the case of FIGURE 4, in which a processing electrode is subdivided into a number of parts, the presence of the unidirectional conducting devices 5 and 13 according to the invention is essential to prevent destruction of the switches as discussed. An unlimited number of switches may be arranged in parallel with the work gap by means of these unidirectional conducting devices, each switch acting, by means of the current-limiting resistor and the unidirectional conducting device which is associated therewith, on one part of a processing electrode of large area.

Figure 5:
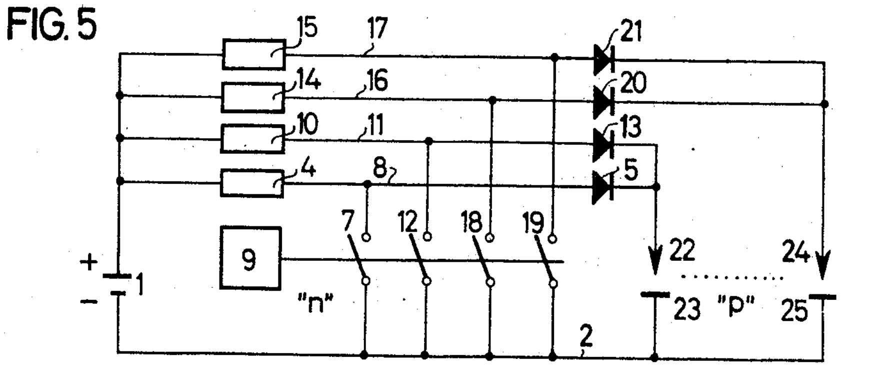

FIGURE 5 illustrates a still further arrangement, in which there is provided a voltage source 1 to which the current-limiting resistors 4, 10, 14, 15 are connected in parallel. Provided in association with each current-limiting resistor through the conductors 8, 11, 16, 17 are respective switches 7, 12, 18, 19. These switches are brought either into the conductive state or into the non-conductive state by a common control unit 9, in the manner described in the foregoing. Unidirectional conducting devices 5, 13, 20, 21 respectively are provided in association with each of these switches. The switches 7, 12 are connected in parallel with an electrode 22, which defines with the workpiece 23 a work gap. The workpiece 23 is connected to the negative pole of the voltage source through the conductor 2. The switches 18, 19 are connected in parallel with the processing electrode 24 through the unidirectional conducting devices 20, 21. Electrode 24 defines with a workpiece 25 a further work gap. The switches 7, 12, 18, 19 constitute an "*n*" number of switches which may be varied as desired, while the work gaps between the electrode 22 and the workpiece 23, and between the electrode 24 and the workpiece 25, constitute a "*p*" number of work gaps. Such a representation is merely intended to show that an unlimited possibility of combinations exists between a number of "*n*" switches which can act in partially parallel arrangement upon a number of "*p*" work gaps. In addition, it is apparent that one current-limiting resistor and one unidirectional conducting device must be present for each switch. In this FIGURE 5, all the work gaps with the switches, current-limiting resistors and unidirectional conducting devices associated therewith are connected to the positive pole of the voltage source 1. However, it is readily possible to employ a plurality of voltage sources instead of only one. For example, a number of circuit arrangements of the type illustrated in FIGURE 3 corresponding to the number of "*p*" work gaps may be combined. All the "*n*" switches may then be brought into the conductive or non-conductive state by means of a single control unit 9. This does not in any way limit the possible variations. This is particularly important if a processing electrode comprises a plurality of parts and the current strength per individual part of the electrode is to be reduced in order to thus obtain a better surface on the workpiece to be processed. Such variations are also advantageous if a common workpiece is to be simultaneously processed by a number of electrodes of a voltage source, for example if five or ten electrodes are to produce in a single workpiece an equal number of recesses in a single electro-erosive working operation.

Figure 6:
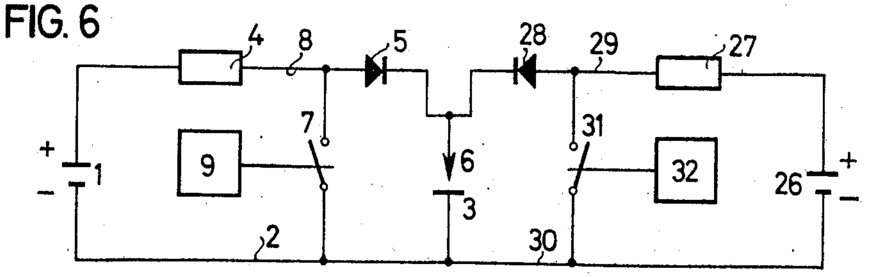

FIGURE 6 illustrates a processing electrode 6 with a workpiece 3. Two voltage sources 1 and 26 are present. The voltage source 1 feeds the electrode 6 through the current-limiting resistor 4, the conductor 8 and the diode 5. Provided between the conductors 8 and 2 is the switch 7, which is actuated by the control unit 9. The voltage source 26 feeds the same processing electrode 6 through the current-limiting resistor 27 and the diode 28. The switch 31 is disposed between the conductors 29 and 30. FIGURE 6 is merely intended to show that, for example, when electro-erosion pulse generators are present which have low current strengths, a number of pulse generators can operate in parallel on a single work gap without the switches being destroyed by undesired currents. In order to more clearly show that two different generators are contemplated here, the switch 31 has been connected to a control unit 32. It is to be noted, however, that an unlimited number of generators may be connected in parallel instead of only two generators as shown. It is then merely necessary for the control devices 9, 32, etc., to be synchronously switched. Althrnatively, a control unit 9 actuating all the switches may be employed, as already mentioned with reference to FIGURE 3. This may be done selectively in accordance with the particular requirements of electro-erosive processing.

Lastly, it is to be noted that the various embodiments illustrated in FIGURES 1 to 6 are exemplary circuit schematics. The spatial arrangement of the various component parts of the circuit arrangement, such as the control unit, the electronic switches and the unidirectional conducting devices may be chosen as desired. Thus, the control unit or units may be spatially separate from the electro-erosion circuits and may be connected to the latter by an appropriate conductor. The individual generators of FIGURE 6 may also be spatially separate. Of course, it is desirable to make the conductors 8, 11, 16, 17, 29 of the individual electro-erosion circuits as short as possible.

In addition to protecting the various switches from overload currents as set forth above, the unidirectional conducting devices of each of the above embodiments serve to suppress any oscillations within the circuits initiated by any distributed inductance or capacitance therein. Accordingly, greater control over the quality of the electro-erosion is achieved as well as a reduction in electrode wear.

It should now be apparent that the objects set forth at the outset of this specification have been successfully achieved.

What is claimed is:

1. An electro-erosion impulse circuit devoid of energy storage elements, said circuit being disposed between a source of direct-current and a work gap, said circuit comprising at least two substantially simultaneously controllable electronic switches each placed in a separate parallel circuit branch with respect to said work gap, for generating working sparks in the work gap defined by the spacing between a processing electrode and a workpiece, unidirectional current conducting means provided in the inductance-free and capacitance-free erosion circuit for each electronic switch, each unidirectional current conducting means being connected in series circuit within a respective separate parallel circuit branch between said work gap and a junction to one pole of said electronic switch, said unidirectional current conducting means being connected in the same polarity to the polarity of said electronic switch.

2. A circuit arrangement according to claim 1, wherein said unidirectional current conducting means comprises a diode.

3. A cricuit arrangement according to claim 1, wherein said unidirectional current conducting means comprises a semiconductor having at least one control electrode.

4. A circuit arrangement according to claim 1, wherein said unidirectional current conducting means comprises a gas discharge tube having at least one control electrode.

5. A circuit arrangement according to claim 1, wherein said unidirectional current conducting means comprises an electron tube having at least one control electrode.

6. A circuit arrangement according to claim 1, further including a current-limiting resistor connected between said source of direct-current and said unidirectional current conducting means.

7. A circuit arrangement according to claim 6, wherein the polarity of said unidirectional current conducting means is such that conventional current flow in the forward direction from said source of direct-current to said work gap is unimpeded.

8. A circuit arrangement according to claim 1, wherein at least two erosion circuits are connected in parallel to one another between one pole of said source of direct-current and a like pole of said work gap.

9. A circuit arrangement according to claim 1, further including at least two separate work gaps; wherein at least two erosion circuits are connected in parallel to one pole of said source of direct-current, and each erosion circuit is connected to a like pole of said at least two separate work gaps.

10. A circuit arrangement according to claim 1, wherein an "*n*" number of erosion circuits are connected in parallel to one pole of said direct-current source and are connected in partially parallel arrangement to a "*p*" number of work gaps, "*n*" and "*p*" being integers.

11. A circuit arrangement according to claim 1, wherein at least two erosion circuits are connected to one pole of a source of direct-current respectively associated therewith and are connected to a like pole of a single work gap.

12. A circuit arrangement according to claim 1, wherein a unit consisting of a voltage source, a plurality of unidirectional current conducting means and an equal number of electronic switches is connected in parallel with at least one further unit containing the same component parts to a single work gap; and further including a single control means to control the conductive and non-conductive states of the electronic switches in all said units.

13. A circuit arrangement according to claim 12, wherein said control means is spatially separate from said electro-erosion circuits.

References Cited

UNITED STATES PATENTS

| | | | |
|---|---|---|---|
| 2,951,930 | 9/1960 | McKechnie | 315—160 |
| 3,056,065 | 9/1962 | Porterfield | 315—207 |
| 3,376,470 | 4/1968 | Stone et al. | 315—176 |

JERRY D. GRAIG, Primary Examiner

U.S. Cl. X.R

307—242; 315—172, 201, 205